United States Patent [19]

Li

[11] Patent Number: 5,696,466

[45] Date of Patent: Dec. 9, 1997

[54] HETEROLITHIC MICROWAVE INTEGRATED IMPEDANCE MATCHING CIRCUITRY AND METHOD OF MANUFACTURE

[75] Inventor: Ping Li, Nashua, N.H.

[73] Assignee: The Whitaker Corporation, Wilmington, Del.

[21] Appl. No.: 569,616

[22] Filed: Dec. 8, 1995

[51] Int. Cl.$^6$ .................................................. H03F 3/60
[52] U.S. Cl. ............................................ 330/286; 330/307
[58] Field of Search ................................. 330/286, 307; 333/247; 257/728

[56] References Cited

U.S. PATENT DOCUMENTS

| | | | |
|---|---|---|---|
| 4,189,682 | 2/1980 | Sechi | 330/307 X |
| 4,737,236 | 4/1988 | Perko et al. | 156/644 |
| 5,268,310 | 12/1993 | Goodrich et al. | 437/15 |
| 5,343,070 | 8/1994 | Goodrich et al. | 257/594 |
| 5,352,998 | 10/1994 | Tanino | 333/247 |
| 5,371,404 | 12/1994 | Juskey et al. | 257/659 |
| 5,407,864 | 4/1995 | Kim | 437/203 |
| 5,477,085 | 12/1995 | Kuse | 257/728 |
| 5,528,055 | 6/1996 | Komori et al. | 257/66 |

OTHER PUBLICATIONS

Maki, "Monolithic Low Noise Amplifiers," *Microwave Journal*, Oct., 1981, pp. 103, 104, 105, 106.

*Primary Examiner*—James B. Mullins
*Attorney, Agent, or Firm*—W. Francos

[57] ABSTRACT

An integrated impedance matching circuit is disclosed using a flip chip process and a heterlithic microwave integrated circuit (HMIC). In a preferred embodiment, a silicon microwave power transistor is flip chip mounted on a glass substrate having a ground plane and silicon pedestals 404 selectively etched and having glass disposed about the silicon pedestals to form the substrate. The glass substrate of the present invention is finely ground and polished to enable VLSI techniques for mass production fabrication. To this end, photolithography and deposition techniques well-known in the art are utilized to effect impedance matching circuitry. Because the input impedance of the Si power transistor is relatively low, by using the flip chip technique the precision of the impedance matching circuit can be effected without the use of wire bonds which must be tuned in a labor intensive manner. Finally, the silicon pedestals of the present invention are used as an electrical ground for the common base as well and as a thermal sink for the system.

12 Claims, 3 Drawing Sheets

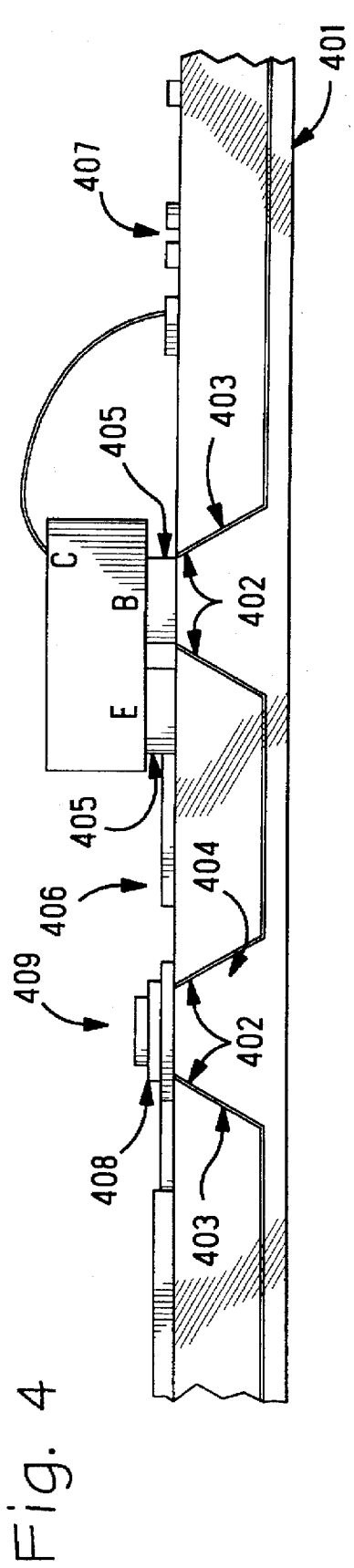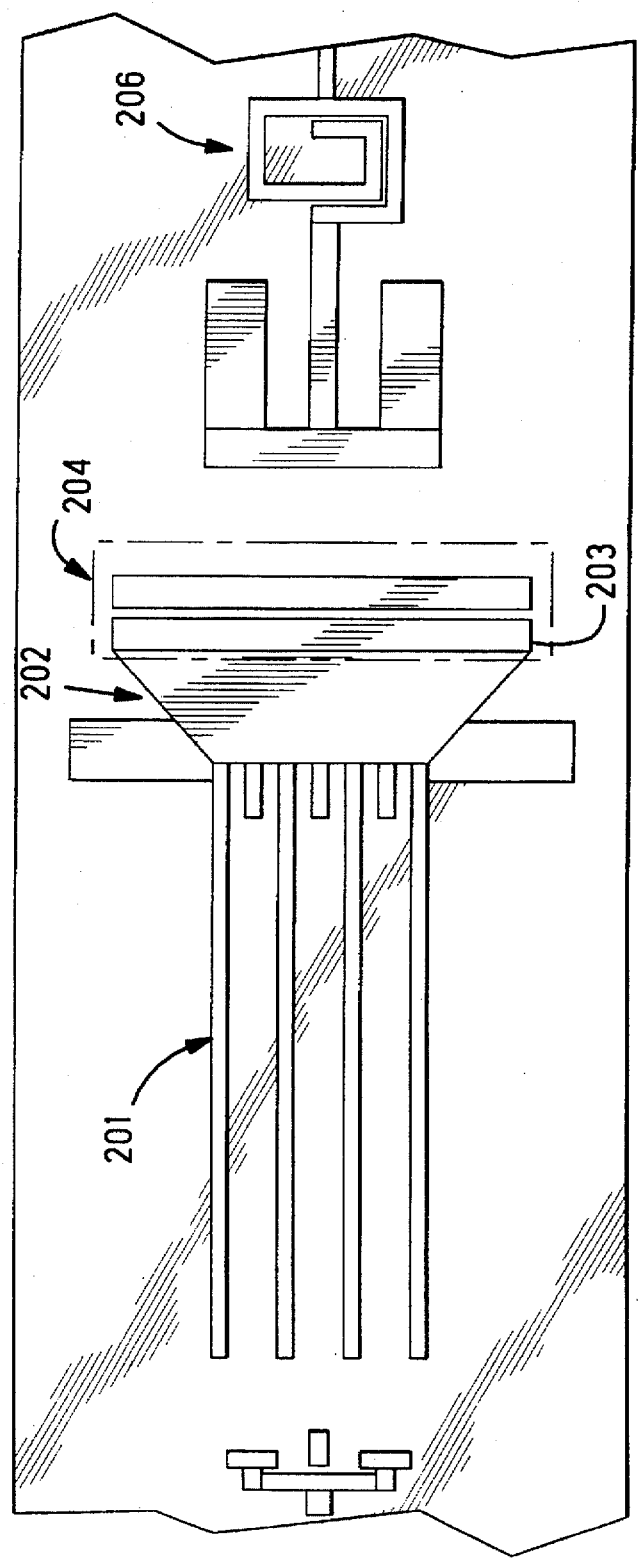
Fig. 4
Fig. 2

HETEROLITHIC MICROWAVE INTEGRATED IMPEDANCE MATCHING CIRCUITRY AND METHOD OF MANUFACTURE

FIELD OF THE INVENTION

The present invention relates to a low cost silicon based RF power amplifier manufacturing method and apparatus. The new technology combines glass based technology and flip chip technology to achieve a high level of integration with a low cost in manufacturing.

BACKGROUND OF THE INVENTION

In the RF and wireless communication industry the frequencies of operation are generally on the order of gigahertz and higher. Accordingly, impedance matching circuitry plays a crucial role in the performance of rf and microwave systems. To this end it is well known to one of ordinary skill in the art that the various elements of a microwave or rf system must be impedance matched. If the elements of the rf or microwave system are not impedance matched there is the adverse effects of back reflection resulting in energy or power loss and reduction in performance of the system. While impedance matching is important in all communications electronics, the ill effects of impedance mismatch are amplified at higher frequencies.

Microwave Si power transistor has very low input impedance and large output capacitance. Thus the internal impedance matching circuits are required for any practical applications. Generally, the silicon microwave power transistors are manufactured by mounting the Si transistors on a ceramic substrate, and subsequently chip capacitors, and bonding wires are utilized to form the impedance matching circuits. In order to effect the required inductance the length and shape of the bonding wires have to be tightly controlled and in many cases manual tuning is required by reshaping the bonding wires. Furthermore chip capacitors must be properly placed and bonded to the ceramic circuit board and while this is a less labor intensive operation than that associated with the bonding wires for the inductance portion of the impedance matching network, there is disclosed in the present application a further improvement to the placement and fabrication of the capacitive elements of the impedance matching network.

To realize low cost and mass production and manufacturing capabilities monolithic microwave integrated circuits (MMIC) technology is preferred, silicon based MMIC devices and circuits have been developed and are now readily available for various rf and microwave applications. However, to this end, the integration of impedance matching circuits and the silicon BJT for power amplifier applications on a chip of silicon using MMIC technology is not advantageous because of the formidable rf loss caused by the conductive silicon substrates. It is very difficult to fabricate low loss/high Q elements on conductive Si substrates. This is the reason why the chip and wire technology, as mentioned above, are still in use to form impedance matching circuits.

What is needed is a new approach using silicon discrete devices for power amplifiers. To this end, what is required is the ability to integrate a system having silicon discrete devices on a substrate that is readily amenable to use at rf and higher frequencies via seamless integration of the discrete silicon device to passive circuits used for impedance matching. Mass production using standard batch mode, monolithic fabrication techniques is also desired as this will drastically reduce the cost of the system as well as improve reliability of various systems. Finally, another drawback to many of the systems of the prior art is in thermal dissipation because generally large amounts of heat is generated in high power applications. To this end, often times an expensive package made by highly toxic beryllium oxide (BeO) material is required to reduce the thermal resistance of this system. The present invention through the use of glass based technology explained herein as well as Si pedestals effects good thermal dissipation of heat as well as a good electrical connection of the base of the silicon BJT to ground in a common base configuration.

SUMMARY OF THE INVENTION

The present invention relates to a new method of fabricating impedance matching circuits on a heterolithic microwave integrated circuit (HMIC) substrate and silicon die integrated into the circuit using a flip chip process. The heterolithic structure includes a readily processed glass substrate having silicon pedestals fabricated therein as well as circuit elements for impedance matching and a flip chip silicon BJT mounted thereto. The silicon pedestals provide the path for thermal dissipation as well as the electrical connection to a ground plane deposited on the lower surface of the glass substrate to effect a common base configuration in one embodiment of the present invention. The present invention effects a silicon microwave power transistor design and manufacturing process which not only reduces the manufacturing and packaging costs of this silicon transistor but also improves device performance. S-band silicon microwave power transistors fabricated by the present invention operate in pulse operations with an output power of 23 watts at 7.9 dB of gain with a 39% efficiency at frequencies of 3.05 gigahertz and a collector voltage $V_{cc}$ of 36 volts. Performance at these levels was achieved without any internal tuning.

OBJECTS, FEATURES, AND ADVANTAGES

It is an object of the present invention to provide a readily manufactured power transistor circuit in large quantity through standard techniques and at lower costs.

It is a feature of the present invention to have a glass substrate having a silicon pedestals disposed therein and a flip chip mounted silicon transistor mounted thereon with impedance matching circuitry manufactured through standard large scale integration techniques also disposed on the substrate.

It is an advantage of the present invention that labor intensive tuning of the input and output impedance matching circuitry is not required.

BRIEF DESCRIPTION OF THE DRAWINGS

FIG. 2 shows a top view of the circuit layout of the 50 ohm matched silicon powered transistor with input impedance matching and output impedance matching circuits shown.

FIG. 4 shows a cross-sectional view of the power transistor package of FIG. 1.

DETAILED DESCRIPTION OF THE INVENTION

Figure 3:
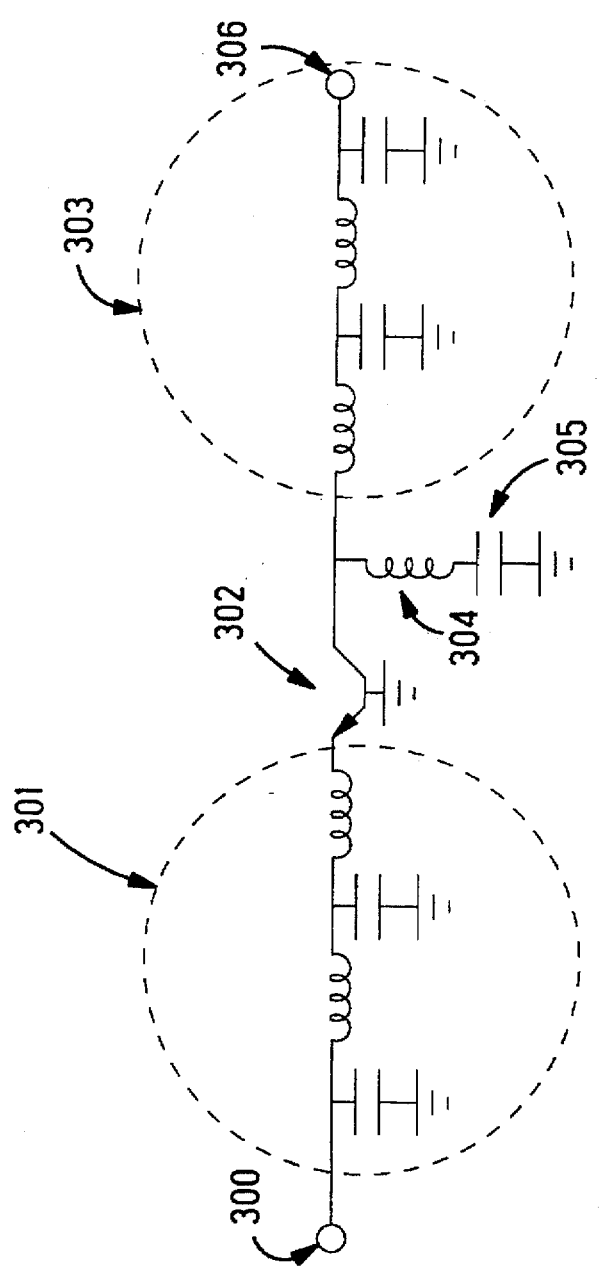
FIG. 3 shows the equivalent circuit diagram for the impedance matching circuit of a common collector silicon BJT power transistor of the present invention.

Referring to FIG. 3 we see a circuit diagram for a impedance matched common base power transistor, the subject of the present invention. The input is at 300 and the input impedance matching circuit, which is a two stage LC impedance matching circuit, is shown at 301. The common base Si BJT is shown at 302. The output impedance matching circuit shown at 303 is connected to a shunt inductor 304 and DC block capacitor 305. As stated previously, in existing silicon power transistor manufacturing, the impedance matching circuits including input and output matching circuits as well as the shunt inductor and DC blocking capacitor, are realized using chip capacitors and bonding wires. For high power transistors sometimes several hundred of the bonding wires are required to effect the required inductance for impedance matching circuits that are required by the system. Since these wires are part of the impedance matching circuit, the length and shape of these wires is important for the performance of the transistor. Very often manual tuning is required through movement and placement of these wires. Therefore, it is an unreliable, labor intensive and high cost fabrication technique to effect the impedance matching on a standard ceramic substrate having chip capacitors and bonding wires comprising the impedance matching circuit elements, shunt inductor and DC block capacitor.

The present invention on the other hand effects the desired circuit as shown in FIG. 3, however, and does so in such a manner as to improve not only the system performance but also to improve the ease and reliability of manufacture which has the intrinsic benefit of reducing the cost of manufacture and increasing the yield. The circuits shown in FIG. 3 is exemplary. It is a common base transistor amplifier circuit and has a two stage input impedance matching circuit. The two stage impedance matching circuit 301 decreases the loaded Q factor and thus increases the bandwidth of the power transistor circuit. It is of course readily understood that other configurations and other common elements of the transistor can be used as well as other impedance matching circuits as is desired. To this end, it is clear that the artisan of ordinary skill could readily implement the teachings of the present invention to effect a wide variety of impedance matching circuits as well as transistor and other elements as required. Accordingly, it is to be understood that the circuit as shown in FIG. 3 as well as the teachings of the invention described herein in accordance with FIG. 3 are for exemplary purposes only and other circuits are clearly anticipated as being within the teaching of the present invention.

To effect the present invention there are two basic technologies utilized. The first is glass technology which enables monolithic processes, to include standard VLSI processes, which allows large scale manufacture in predictable and reliable manner as opposed to the use of discrete elements to effect a power transistor circuit with impedance matching circuits connected thereto. The second aspect of the invention is using flip chip technology in conjunction with the glass technology of the present invention. This flip chip and glass technology combination reduces greatly the parasitic inductance from bonding wires as well as enables the realization of relatively low inductances required for the input matching circuit, on the order of 0.07 nH. Finally, the flip chip technology and the glass technology further enable the use of the silicon pedestals to effect thermal dissipation of the power transistor as well as the electrical connection to ground.

As stated above the glass based technology is one important aspect of the present invention. This technology in combination with the silicon pedestals described hereinbefore and hereinafter combined with the passive elements fabricated on the glass substrate effect the HMIC technology, the heterolithic microwave integrated circuitry. The use of the substrate as well as the pedestals and the mounting of the silicon BJT and fabrication of the passive elements is described presently. Starting with a monocrystalline substrate of silicon doped with arsenic to effect the resistivity less than 0.003 ohm-cm, the silicon pedestals are defined through known anisotropic etching techniques to effect side walls parallel to define crystalline planes. Details of etching of monocrystalline materials can be found in U.S. Pat. No. 4,210,923 to North et al the disclosure of which is specifically incorporated by reference. Predictable and reproducible geometries are fabricated by this process with the final pedestals 404 having sidewalls 402 in well defined planes as shown in FIG. 4. The height of the pedestal is preferably on the order of 125–250 microns. Thereafter, a high conductivity silver ground plane 403 is deposited onto the substrate 401 and sidewall 402 to effect the electrical and thermal conduction via the silicon pedestals. Thereafter the glassing technique is effected in which the trenches between the pedestals and about the pedestals is filled with low loss glass. After the glassing step the glass is at least 50 microns thicker than the depth of the silicon pedestals. The wafer then undergoes a grinding process, followed by a standard polishing process which is used to polish the wafer to expose the top of the silicon pedestals. The planar glass wafer with its smooth surface finish allows for fine line lithography. Further details of the proper use of the smooth surface finish of the planar glass wafer for fine line lithography can be found in U.S. patent application Ser. No. 08/610,825 to Chinoy, the disclosure of which is specifically incorporated by reference.

As stated previously the use of the glass substrate and silicon pedestals allows for VLSI technology which is readily known in the art to be used to effect the structure in automated batch processing. The silicon pedestals provide both electrical grounding and thermal dissipation which is vital for power amplifiers. The selective placement of the pedestals enables various configurations as needed to effect the heat dissipation and electrical grounding. The glass which is Corning 7070 has a low dielectric constant and a low loss tangent which provides good electrical edge isolation and mechanical support. To this end the glass material used has a dielectric constant preferably of 4.1 and a loss tangent of 0.002 at 10 GHz. Because the glass material is amorphous material it can be polished to a fine surface finish. Therefore it can readily support thin film deposition and fine line photolithographic processes in large scale integration. Batch processes can be used to fabricate passive circuit elements such as spiral inductors, capacitors, and thin film resistors at low cost high performance at a low cost while maintaining high performance and good reliability and yield. The low lost tangent of the glass allows the fabrication of the high-Q passive elements which are essential for power amplifier circuits. The nature of the thin film process provides a glass based technology having at least the same level of integration as GaAs based monolithic microwave integrated circuit technology.

Figure 5:
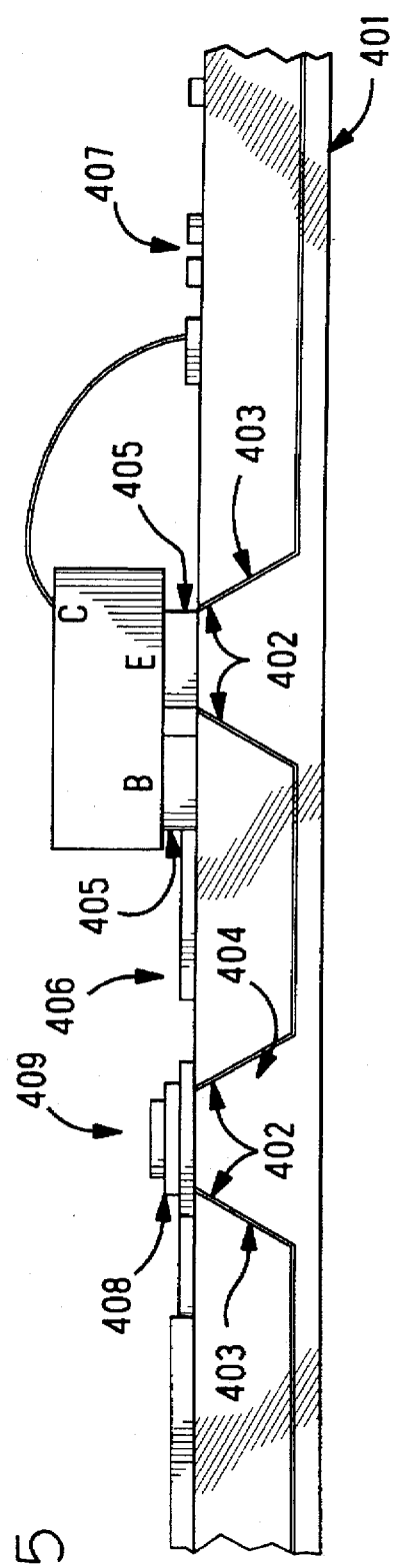
FIG. 5 is an alternative embodiment of the present invention having a common emitter configuration.

To achieve high Q for inductors without compromising the process the final glass thickness is preferable 200 microns. To effect the flip chip mounting pads 405 as well as the interconnection 406 and impedance matching circuitry for example spiral inductor 407, standard metallization lift off processes were used. Generally, a Pt/Pt/Au was used as a metallization and a layer of silicon nitride ($Si_3N_4$) was used as the interlayer of dielectric 408 in the capacitor 409. Finally the connection 406 to the emitter contact 405 is effected by metal deposition as described above. FIG. 2 is a top view showing the power transistor with impedance matching circuits at the input and output shown in cross-section in FIG. 4. FIG. 5 shows an alternative embodiment in which a common emitter configuration is used. To this end, the input impedance matching circuit 201 is connected to the emitter contact 203 of the transistor 204 via the interconnect 202. The output impedance matching circuit is shown at 206 and is connected to the collector contact by wirebonds, not shown in FIG. 2.

Figure 1:
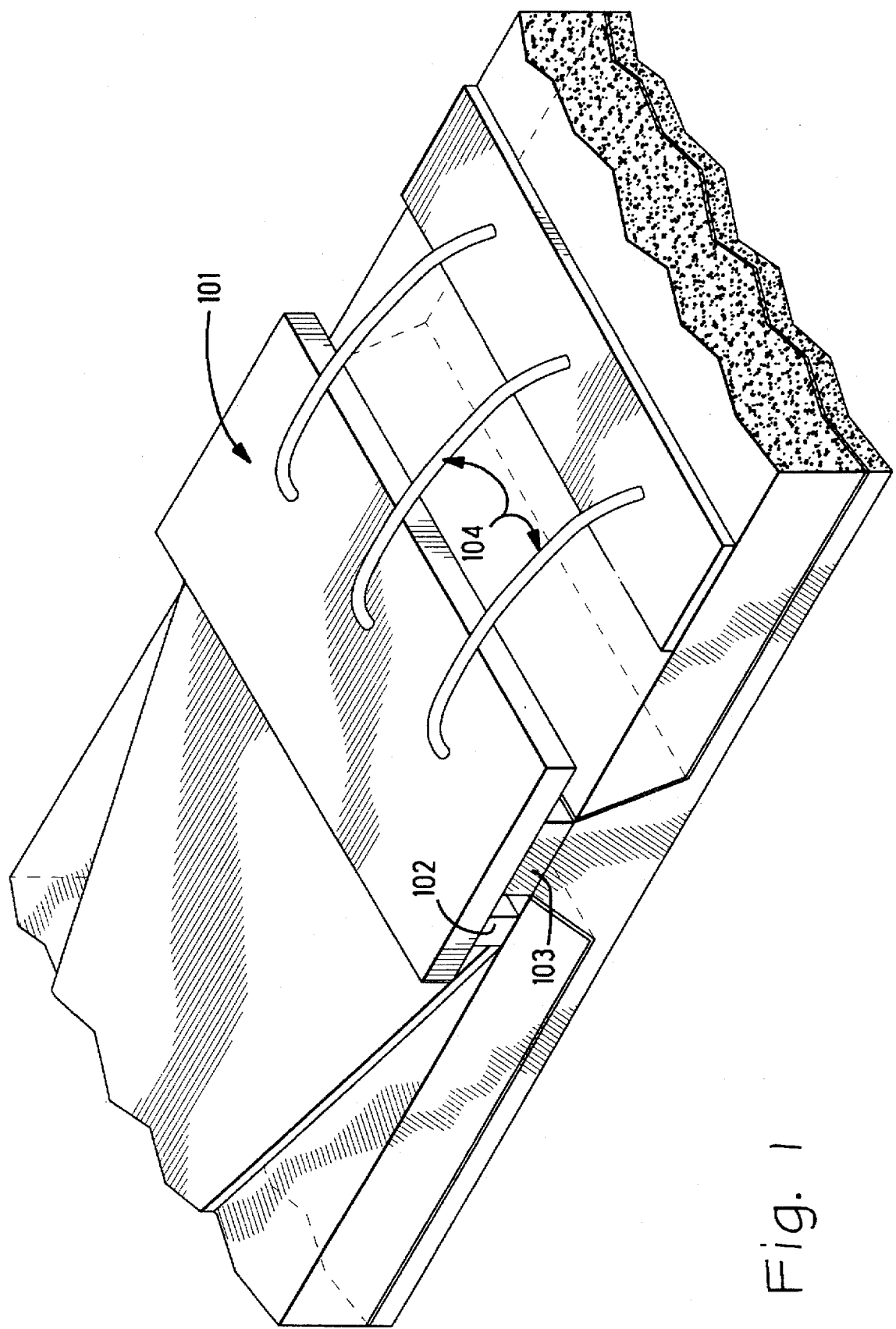
FIG. 1 shows a perspective view of the silicon power transistor package of the present invention.

Turning now to a discussion of the flip chip technology, while of course it is important to use the glass based technology to effect the HMIC substrate, integrating discrete devices onto the passive glass circuit is very important in order to take full advantage of the glass based technology. The conventional approach is to mount discrete devices on top of the substrate and make electrical interconnections by bond wires. The present invention improves upon a great deal of the interconnections of the system by the use of flip chip technology which eliminates the need for wire bonding in many applications. For most of the silicon discrete power devices, the collector is on the backside of the die. Although it is desirable to mount the discrete device on top of the silicon pedestal for the purposes of heat dissipation, it will severely degrade the circuit performance in this configuration since the silicon pedestals are electrically grounded. Furthermore the bond wires for the base and the emitter connections have a certain amount of parasitic inductance. For common emitter configuration circuits the emitter parasitic inductance will not only reduce the power gain but also is likely to induce oscillation due to its common mode nature, while the base parasitic inductance will introduce uncertainty in the impedance matching circuit design. While for common base configuration the circuit base parasitic inductance is common mode inductance thus could cause stability problems. To resolve these issues, silicon discrete devices have to be seamlessly integrated into the passive glass circuits with minimum parasitic inductance. Therefore, a novel flip chip process has been implemented for this purpose. As is shown in FIG. 1, the collector contacts are at 101 and the emitter contacts at 102 with the base contact at 103. The emitter and base contacts are formed by solder bumps and bonding wires 104 are only required for the connection to the collector. Because for most power devices the output impedance is much higher than the input impedance, the use of bonding wires on the collector to effect the connection to the output of the circuit is adequate because the ill effects of this technique are much smaller than would be the case on the input side of the device. To this end, the reduction of parasitic inductance, on the base and emitter side of the device improves greatly the performance of the system. It is, of course, of interest to note that if all three terminals of the device can be on the front side (for example e.g. lateral power silicon MOSFET) all the bonding wires can be eliminated.

In common base configuration circuit the use of the flip chip technology allows the base to be directly bonded to the silicon pedestal which provides electrical grounding and high thermal conduction paths as previously described. The interconnection bumps 405 are formed by metal evaporation lift/off processes. The evaporation lift/off processes provide a flat contact surface substantially free of voids which has important ramifications from a thermal perspective because a good mechanical contact is required to achieve the lowest thermal resistance. Furthermore, the process assures simple fabrication which of course reduces the overall cost of the device as well as yield reliability. The metal bumps consist of Au/Pt/Au:Sn layers, with the gold layer forming the major portion of the bump. Since the bump is on the top of the device active area the mechanical load to the active region during the flip chip bonding process has to be minimized. Thus the Au:Sn is selected as the top layer and the bonds between the transistor and the HMIC substrate are formed by Au:Sn eutectic bonding. Platinum (Pt) is used as the diffusion barrier between the gold and the Au:Sn layers.

The power transistor employed in this flip chip amplifier is fabricated as follows. A highly conductive $n^+$ silicon wafer is used as a substrate to epitaxially grow a relatively thin n type collector. The base and emitter regions are then formed by sequentially localized ion implantation of boron into the epitaxial collector and arsenic into the base area. In addition a highly conductive $p^+$ ring surrounding the active base region is employed in order to enhance the $\beta$ $V_{ces}$ breakdown. Also, a highly conductive $p^+$ base contact to minimize contact and saturation resistances is incorporated into this structure by boron and $BF_2$ ion implantation techniques. This process has been demonstrated to consistently produce low noise silicon bi-polar junction transistors having an $f_T$ in the range 10–12 gigahertz.

In order to transform this low noise structure into a device capable of producing reasonable power output levels, emitters site ballasting must be incorporated into the transistor to ensure proper current between all the discrete emitter sights. This is a accomplished by the addition of an arsenic doped polycrystalline silicon layer which is used to form separate resistors in series with each emitter sight. The arsenic doping is achieved by standard ion implantation techniques.

Finally, the choice of the device mounting process is dictated by the solder bump metallurgy. The bonding process starts with aligning the silicon discrete device to the passive glass substrate. Then reliable bonding is formed by reflowing a Au:Sn solder at 320° C. for five minutes. During the reflow process static pressure on the order of 40 pounds per square inch is applied to the backside of the device. After the device is bonded, the collector was bonded to the circuit using Au wires. Four bond wires were used to minimize the parasitic inductance.

As stated above it is clearly anticipated that other devices can be used as well as other impedance matching circuits can be implemented in various configurations to effect the improved impedance matching circuits as described above using glass and silicon pedestals in a readily manufacturable form within the purview of one of ordinary skill in the art. Accordingly, the alternative implementations of the teachings of the present invention within the theme and spirit of the above teaching that would have been obvious to one of ordinary skill in art are intended to be clearly within the purview of the present invention.

I claim:

1. A heterolithic microwave integrated circuit, comprising:

a ground plane having disposed thereon a glass substrate, said glass substrate having at least one selectively disposed silicon pedestal therein, a transistor disposed on top of said substrate said transistor having at least one contact connected to said at least one of said silicon pedestals, and input and output impedance matching circuitry disposed on top of said substrate selectively connected to said transistor.

2. A microwave integrated circuit as recited in claim 1, wherein flip chip mounting pads are disposed selectively on said substrate for selective electrical and thermal connections.

3. A microwave integrated circuit as recited in claim 1 wherein said transistor is a bipolar junction transistor having an emitter, a base, and a collector, wherein said base is connected to one of said silicon pedestals, forming a common base configuration.

4. A microwave integrated circuit as recited in claim 1, wherein said transistor is flip chip mounted on said substrate.

5. A microwave integrated circuit as recited in claim 1, wherein said input impedance matching circuit has a connection between said input impedance matching circuitry and said transistor, said interconnection being fabricated on said top surface of said substrate.

6. A microwave integrated circuit as recited in claim 1, wherein said input and output impedance matching circuitry further comprises selectively disposed spiral inductors and capacitors.

7. A heterolithic microwave integrated circuit comprising a ground plane having a glass substrate disposed thereon, said glass substrate having at least one selectively disposed silicon pedestals therein, a flip chip mounted transistor disposed on top of said substrate, said flip chip mounted transistor selectively connected to at least one of said silicon pedestals by flip chip mounting pads, and input and output impedance matching circuitry selectively disposed on said substrate, said input and output impedance matching circuitry being substantially formed by thin film deposited inductors and capacitors.

8. A microwave integrated circuit as recited in claim 7, wherein said flip chip mounted transistor has a collector, a base, and an emitter wherein emitter is connected to at least one of said silicon pedestals via a flip chip mounting pad, and forms a common emitter configuration.

9. A microwave integrated circuit as recited in claim 8, wherein said silicon pedestal connected to said emitter effects an electrical ground as well as a thermal heat sink.

10. A microwave integrated circuit as recited in claim 7, wherein said input and output impedance matching circuitry effects a microwave integrated circuit having reduced parasitic inductive effects.

11. A microwave integrated circuit as recited in claim 7 wherein said flip chip mounted transistor has a collector, a base, and an emitter and said base is connected to at least one of said silicon pedestals via a flip chip mounting pad, forming a common base configuration.

12. A microwave integrated circuit as recited in claim 11 wherein said silicon pedestal connected to said base effects an electrical ground as well as a thermal heat sink.

* * * * *